(12) United States Patent
Schroedinger

(10) Patent No.: US 6,483,960 B2
(45) Date of Patent: Nov. 19, 2002

(54) OPTOMODULE AND CONNECTION CONFIGURATION

(75) Inventor: Karl Schroedinger, Berlin (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/894,943

(22) Filed: Jun. 28, 2001

(65) Prior Publication Data

US 2002/0001428 A1 Jan. 3, 2002

(30) Foreign Application Priority Data

Jun. 28, 2000 (DE) .......................... 100 32 796

(51) Int. Cl.[7] .............................. G02B 6/12
(52) U.S. Cl. .................. 385/14; 385/88; 257/80; 257/84
(58) Field of Search ............ 385/14, 88; 257/80, 257/81, 82, 84

(56) References Cited

U.S. PATENT DOCUMENTS 6,330,377 B1 * 12/2001 Kosemura ................. 385/14

FOREIGN PATENT DOCUMENTS

DE   3429282 A1   4/1985

OTHER PUBLICATIONS

Carsten Schwantes: "Small Form Factor: Higher Density for Fiber Based High Speed Networking", Electronic Components and Technology Conference IEEE, 1999, pp. 539–542.

* cited by examiner

Primary Examiner—Robert H. Kim
Assistant Examiner—Elizabeth Gemmell
(74) Attorney, Agent, or Firm—Laurence A. Greenberg; Werner H. Stemer; Ralph E. Locher

(57) ABSTRACT

An optomodule has a carrier substrate; wiring applied on a front side of the carrier substrate; contacts configured on a rear side of the carrier substrate and electrically connecting to a line of the wiring via at least one plated-through hole formed in the carrier substrate; and an optosemiconductor for transmitting and/or for receiving light. The optosemiconductor electrically contacts the line of the wiring and is configured on a front side of the carrier substrate in the region of a through opening formed in the carrier substrate, in such a way that the light can be transmitted and/or received through the through opening.

25 Claims, 4 Drawing Sheets

OPTOMODULE AND CONNECTION CONFIGURATION

BACKGROUND OF THE INVENTION

Field of the Invention

The invention lies in the field of optical components, in particular optical subcomponents, which are also referred to as opto-ICs.

Such optical components are used to generate, to receive, to convert, to process, etc., optical signals. By way of example, a PIN-photodiode-preamplifier combination may be involved. The construction of the optical subcomponents on the basis of T046 housings is prior art.

The article by C. Schwantes: "Small Form Factor: Higher Density For Fiber Based High Speed Networking", *Electronic Components and Technology Conference IEEE*, 1999, pages 539–542, discloses optical subcomponents or optomodules on the basis of lead frame technology. The increasing dissemination and application of optomodules demands a higher degree of integration density, which cannot be achieved using these prior-art technologies.

SUMMARY OF THE INVENTION

It is accordingly an object of the invention to provide an optomodule that overcomes the hereinafore-mentioned disadvantages of the heretofore-known devices of this general type and that enables a higher integration density of the components of the optomodule.

With the foregoing and other objects in view, there is provided, in accordance with the invention, an optomodule. The optomodule includes a carrier substrate having a front side and a rear side and a plated-through opening formed therein. The optomodule also includes wiring applied on the front side of the carrier substrate having at least one line. The optomodule also includes contacts configured on the rear side of the carrier substrate and electrically connected to a line of the wiring via the plated-through opening. The optomodule includes an optosemiconductor for transmitting and receiving light. The optosemiconductor electrically contacts the line of the wiring and is disposed on the front side of the carrier substrate near the through opening formed in the carrier substrate, in such a way that the light can be transmitted and received through the through opening.

With the objects of the invention in view, there is also provided a connection configuration. The connection configuration includes an optomodule as described above. The connection configuration also includes a printed circuit board section. The contacts electrically contact a wiring of the printed circuit board section. The optomodule and the contacts mount on the printed circuit board section so light can be passed through an opening in the printed circuit board section.

The optomodule achieves the object of the invention. The optomodule includes a carrier substrate; wiring applied on a front side of the carrier substrate; contacts, which are configured on a rear side of the carrier substrate and are electrically connected to a line of the wiring via at least one plated-through hole formed in the carrier substrate; and an optosemiconductor for transmitting and/or for receiving light. The optosemiconductor being electrically contacts the line of the wiring and being configured on a front side of the carrier substrate in the region of a through opening, formed in the carrier substrate, in such a way that the light can be transmitted and/or received through the through opening.

The invention is based on the essential concept of utilizing, in the context of construction and production of optomodules with an optosemiconductor, technologies of the kind used for integrated circuits. This enables a high level of integration of the components of the optomodule because the wiring of the carrier substrate can be realized in a significantly more complex and more flexible manner than with the known technologies, for example the lead frame technology.

An essential advantage of the invention compared with the prior art is that an improved radio frequency capability of the optomodule, in particular of the carrier substrate, is ensured. This is the consequence of the improved wiring possibilities and short connections of radio frequency components, for example capacitors in the carrier substrate.

A further advantage of the invention is that it is possible to utilize technologies and processing steps for the embodiment of which there exists comprehensive experience in connection with the fabrication of integrated circuits.

A development of the invention provides for the optosemiconductor to be configured on a front-side surface of the carrier substrate, thereby enabling the optosemiconductor to be applied simply and in a manner that can be performed with little outlay.

In an advantageous refinement of the invention, a protective layer at least partly surrounds the optosemiconductor and is applied on the front side of the carrier substrate in such a way that an essentially closed protective surface is formed. Thereby, a protection against mechanical interfering influences during the use or the deployment of the optomodule is formed.

In one embodiment, a component is expediently configured on the front side of the carrier substrate. The component is in electrical contact with the optosemiconductor and the line of the wiring and is at least partly surrounded by the protective layer. This enables the optosemiconductor to be connected for operation and control purposes.

A potting compound or an injection-molding compound preferably forms the protective layer. This allows a protective layer to be produced with the aid of known techniques in a simple manner.

A preferred embodiment of the invention with regard to the use of modern chip fabrication technologies provides for the optosemiconductor and/or the component to be connected to the line of the wiring in each case via at least one bonding connection.

A preferred refinement of the invention with regard to the complex wiring and the improved radio-frequency capability provides for the wiring to comprise at least one wiring plane and a ground plane.

An expedient development of the invention provides for the carrier substrate to be formed from a printed circuit board material. As a result of which, a multiplicity of proven techniques is available for the processing of the carrier substrate.

An expedient refinement of the invention with regard to the interference-free functionality of the optomodule provides for a shield to be formed for the optosemiconductor and/or the component. The shield is formed with the aid of a shielding layer. The shielding layer extends essentially over the entire region of the carrier substrate.

In order to increase the integration density of the optomodule, the shielding layer may be encompassed by the carrier substrate.

In an expedient development of the invention, a low-inductance connection of the optomodule can be ensured by the contact being solder balls.

A preferred embodiment with regard to the flexibility of the connection of the optomodule provides for the contact, in each case, to be electrically connected to connecting pins.

In an advantageous embodiment, improved coupling of the light emitted by the optosemiconductor or of the light to be coupled onto the optosemiconductor can be achieved by an optical imaging element being configured in the through opening.

A preferred refinement of the invention with regard to the directing of the light emitted by the optosemiconductor to another component, for example a plug with an optical waveguide, provides for an optical element to be configured on a rear-side surface of the carrier substrate, so that the light passing through the through opening can be directed optically.

The advantages associated with the optomodule described expediently extend and improve the application possibilities for the optomodule when a connection configuration having such an optomodule and a printed circuit board section is formed, the contacts are in electrical contact with a wiring of the printed circuit board section, and the optomodule is mounted with the aid of the contacts on the printed circuit board section so that the light can be transmitted and/or received through an opening in the printed circuit board section. In this way, a flexible connection of the optomodule to a multiplicity of other circuit components or circuits is possible.

In a preferred development of the invention, a high level of integration of such a connection configuration can be achieved by a light channel being formed in the printed circuit board section, so that transmitted light which is transmitted from the optosemiconductor through the through opening in the carrier substrate can be coupled into the light channel, and received light can be coupled from the light channel through the through opening in the carrier substrate onto the optosemiconductor.

In an advantageous embodiment, guiding of the light in the light channel is made possible with the aid of an optical deflector configured in the light channel and/or of an optical imager.

In a preferred development of the invention, it may be provided that a section of a flange structural part is configured in the opening in the printed circuit board section, so that a connection is formed between an end-side surface section of the flange structural part and a rear-side surface section of the carrier substrate. The flange structural part has a receptacle section for at least partly receiving a plug structural part. The plug structural part is configured in the receptacle section in such a way that the light emitted by the optosemiconductor and/or the light received by the optosemiconductor can be coupled into the plug structural part or coupled out from the plug structural part. This enables compact coupling between the optomodule and a flange structural part that can be utilized for connecting different structural parts.

A preferred development of the invention with regard to the mechanical loadability of the connection configuration provides for a flange structural part to be configured on a surface of the printed circuit board section. The surface is remote from the optomodule, in the region of the opening in the printed circuit board section. The flange structural part has a receptacle section for at least partly receiving a plug structural part. The plug structural part is configured in the receptacle section in such a way that the light emitted by the optosemiconductor and/or the light received by the optosemiconductor can be coupled into the plug structural part or coupled out from the plug structural part.

In order to avoid optical losses, it may be provided, in an expedient development of the invention, that there is configured in the flange structural part, an optical imaging element for coupling the light into and/or out of the plug structural part.

Other features which are considered as characteristic for the invention are set forth in the appended claims.

Although the invention is illustrated and described herein as embodied in an optomodule, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
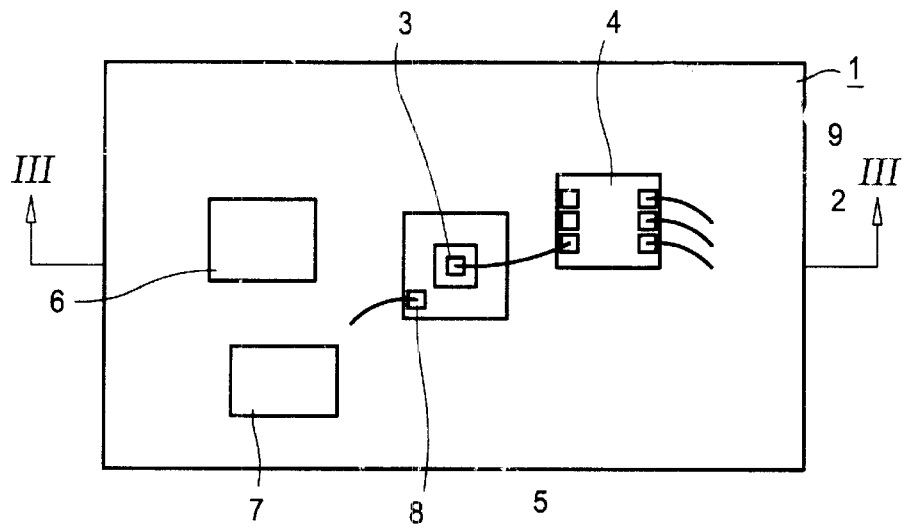
FIG. 1 is a diagramatic, top-plan view of an optomodule.

In all the figures of the drawing, sub-features and integral parts that correspond to one another bear the same reference symbol in each case.

Referring now to the figures of the drawings in detail and first, particularly to FIG. 1 thereof, there is shown an optomodule 1. An optosemiconductor 3, an integrated circuit 4, which is in electrical contact with the optosemiconductor 3 via a bonding connection 5, and also further components, for example capacitors 6, 7, are configured on a carrier substrate 2. The optosemiconductor 3 and the integrated circuit 4 are in each case connected via bonding connections 8, 9 to wirings (not illustrated) formed on the carrier substrate 2, preferably in wiring planes (not illustrated). Bonding connections of this type can, of course, also be provided for the further components 6, 7. In this case, the wiring planes enable a complex and flexibly configurable embodiment of the electrical connections between the optosemiconductor 3, the integrated circuit 4, and the further components 6, 7. In this way, optomodules 1 can be produced with complicated wiring paths and circuit configurations. One or more ground planes are preferably provided.

The "Chip Size Package" or the "Ball Grid Array" technology can be utilized as technologies for producing the optomodule 1. The application of these technologies in conjunction with the optomodule 1 including the optosemiconductor 3 enables a high integration density of the individual components of the optomodule 1.

Figure 2:
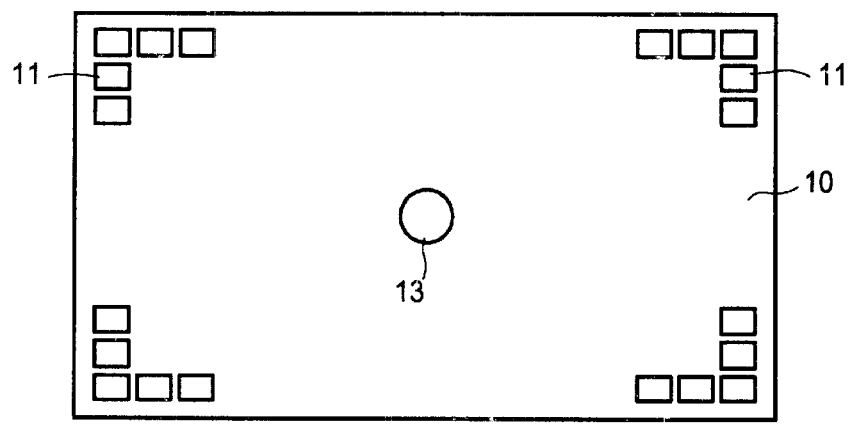
FIG. 2 is a bottom plan view of the optomodule.

FIG. 2 shows the optomodule 1 from below. Soldering pads 11 are configured on the bottom surface 10 of the optomodule 1. The soldering pads 11 form contacts for connecting the optomodule 1 to external circuit components. With the aid of the soldering pads 11, the optomodule 1 can be soldered onto a printed circuit board, for example.

Figure 3:
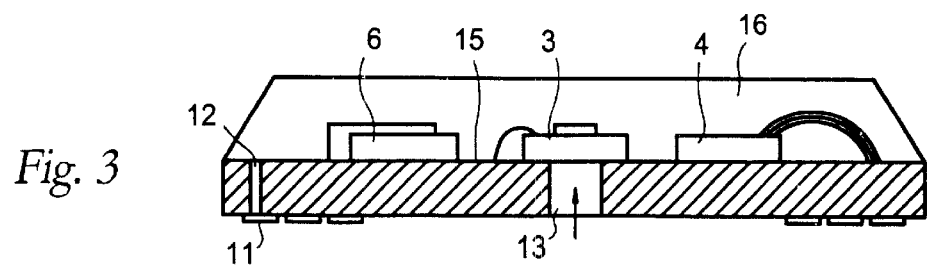
FIG. 3 is a cross-sectional view of the optomodule taken along a line III—III shown in FIG. 1, in the direction of the arrows.

FIG. 3 shows a cross-sectional illustration of the optomodule 1. According to FIG. 3, the soldering pads 11 are connected to plated-through holes 12 formed in the carrier substrate 2. In this way, an electrical contact is produced between the soldering pads 11 and the wiring plane (not illustrated), with the result that the optosemiconductor 3, the integrated circuit 4, and also the further components 6, 7 can be connected to external circuit components via the soldering pads 11, the plated-through hole 12 and the wiring plane.

The carrier substrate 2 has a through opening 13 in a region of the optosemiconductor 3 (cf. FIG. 2). Light emitted by the optosemiconductor 3 and/or light that is to be coupled onto the optosemiconductor 3 passes through the through opening 13. Provision may be made for configuring an optical imaging element (not illustrated) in the through opening 13, in order to deflect the light and/or focus it onto the optosemiconductor.

Figure 4:
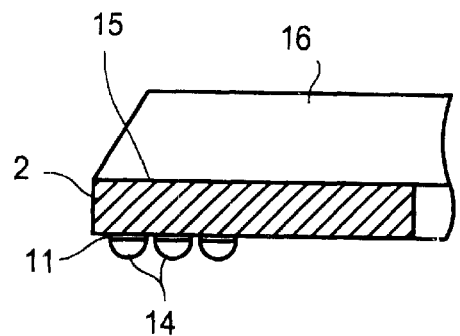
FIG. 4 is a fragmentary, elevational and enlarged partial sectional view of the optomodule according to FIG. 3.

FIG. 4 shows an enlarged illustration of a section of the optomodule 1 according to FIGS. 1 to 3. A solder ball 14 is configured on each of the soldering pads 11. The use of the solder balls 14 enables a low-inductance connection of the optomodule 1 to external circuit components. The solder balls 14 have, in particular, a lower inductance than connecting pins, as are known from lead frame technology.

According to FIGS. 3 and 4, a compound 16 is applied on a top surface 15 of the carrier substrate 2 and encapsulates the optosemiconductor 3, the integrated circuit 4, the further components 6, 7, and also the bonding connections 5, 8 and 9. The compound 16 may be a potting compound or an injection-molding compound and serves to protect the electrical components of the optomodule 1. The compound 16 can be applied by potting or injection molding using known production techniques, as are known from the field of integrated circuit fabrication. The compound 16 helps to provide mechanical protection of the electrical components of the optomodule 1. For heat dissipation purposes, heat sinks, preferably cooling plates, may be encapsulated by the compound 16 by potting or injection molding.

Figure 5:
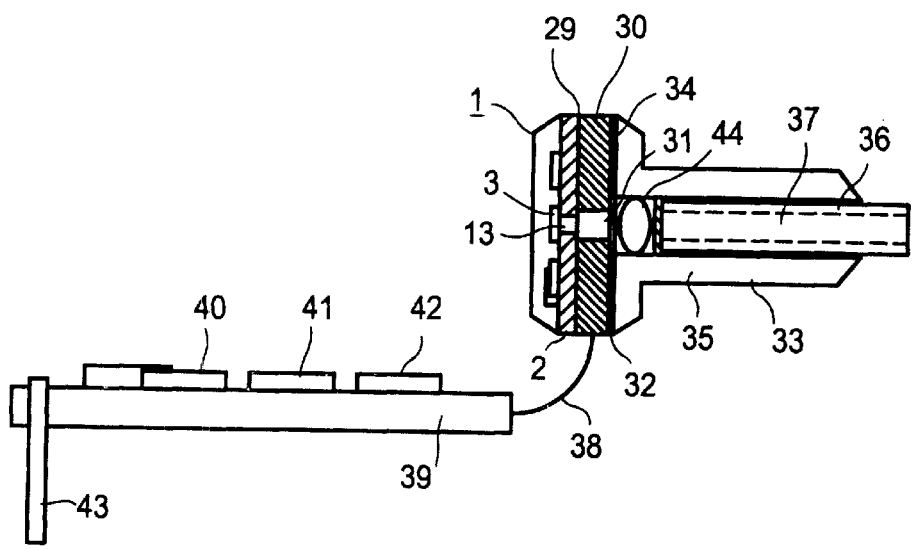
FIG. 5 is a side view showing a connection configuration having an optomodule according to FIG. 3 and a printed circuit board section, the connection configuration being coupled to a flange structural part.

The optomodule 1 according to FIGS. 1 to 3 may, after production, be processed further in such a way that it is soldered on a printed circuit board section 30, as is illustrated by way of example in FIG. 5. A soldered connection 29 is formed between the printed circuit board section 30 and the optomodule 1. In this case, the optomodule 1 is positioned on the printed circuit board section 30, with the result that the through opening 13 in the carrier substrate 2 is configured relative to an opening 31, formed in the printed circuit board section 30, in such a way that the light emitted by the optosemiconductor 3 can pass through the through opening 13 in the carrier substrate 2 and the opening 31 in the printed circuit board section 30.

A flange structural part 33 is fixed, with the aid of an adhesive bond 34, on a surface 32 of the printed circuit board section 30. The surface 32 is remote from the optomodule 1. A plug pin 36 is configured in a receptacle section 35 of the flange structural part 33. The plug pin 36 includes an optical waveguide 37, into which the light emitted by the optosemiconductor 3 is coupled. Light that is transmitted with the aid of the optical waveguide 37 can, of course, also be coupled onto the optosemiconductor 3.

The printed circuit board section 30 is connected to a module printed circuit board 39 via a flexible conductor section 38. A plurality of external components 40, 41, and 42 are mounted on the module printed circuit board 39. In this way, the optosemiconductor 3, which is connected via the soldered connection 29 to the wiring of the printed circuit board section 30, can be coupled to the external components 40, 41 and 42 with the inclusion of the flexible conductor section 38 and the module printed circuit board 39. Furthermore, a connecting pin 43 is formed on the module printed circuit board 39 and enables the module printed circuit board 39 to be plugged onto a base.

In order to avoid optical losses when the light is coupled into the optical waveguide 37 or when light is coupled onto the optosemiconductor 3, an optical imaging element 44 is configured in the flange structural part 36. An imaging lens may be involved in this case (cf. FIG. 6).

Figure 6:
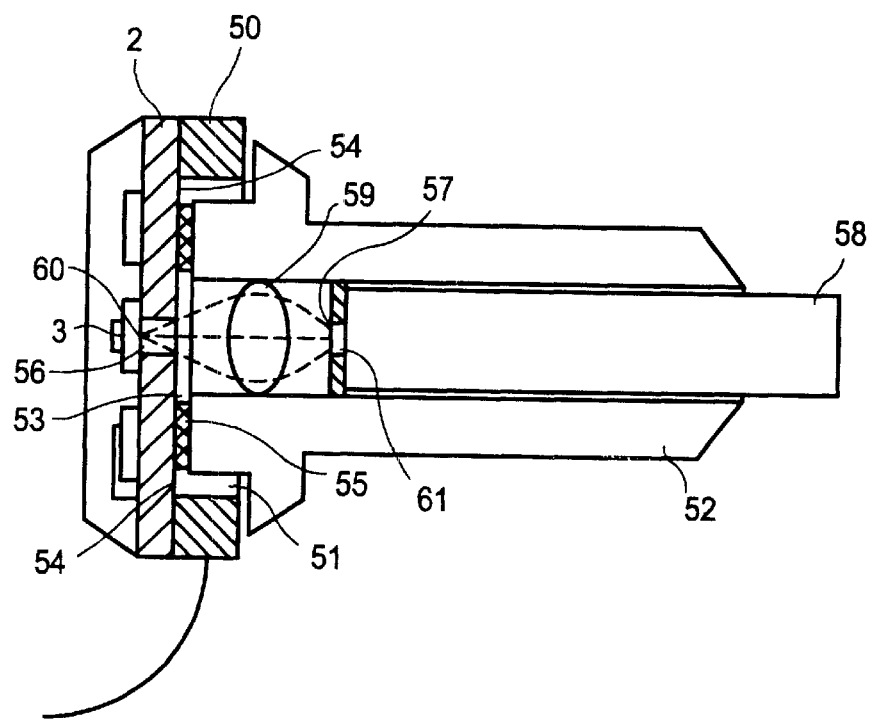
FIG. 6 is an enlarged partial view of the connection configuration according to FIG. 5.

FIG. 6 shows a connection configuration in which an opening 51 is formed in a printed circuit board section 50 in such a way that a flange structural part 52 can be partly inserted into the opening 51, with the result that an adhesive bond 55 can be formed between an end-side surface 53 of the flange structural part 52 and a bottom surface 54 of the carrier substrate 2. Consequently, the difference with respect to the embodiment according to FIG. 3 is that a direct connection is formed between the flange structural part 52 and the carrier substrate 2.

In FIG. 6, an optical lens element 59 is configured between a transmitting/receiving area 56 of the optosemiconductor 3 and an end face 57 of an optical waveguide 58 in order to avoid optical losses. In this case, the optical lens element is optimized to the effect that focussing points 60, 61 are produced on the transmitting/receiving surface 56 of the optosemiconductor 3 and, respectively, on the end face 57 of the optical waveguide 58.

Figure 7:
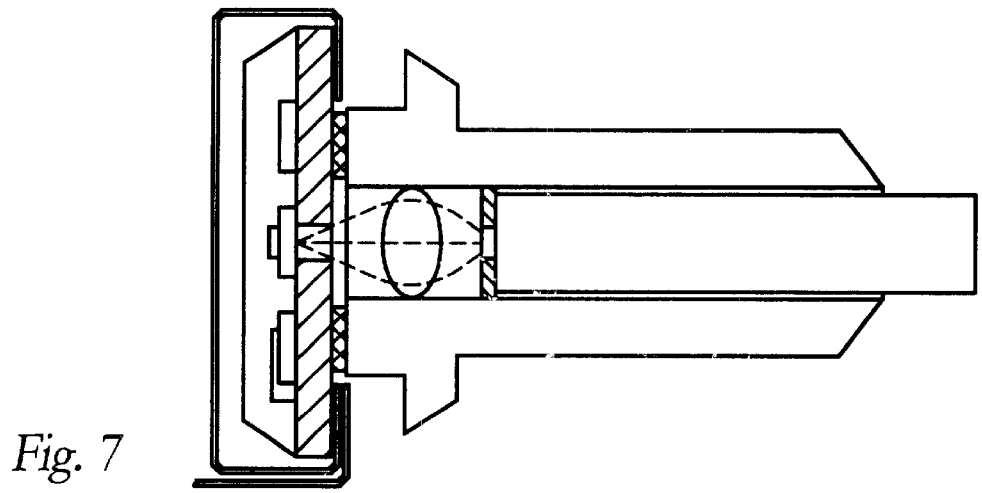
FIG. 7 is a side view an optomodule according to FIG. 3 on a flange structural part, the optomodule being partly encompassed by a shield.

FIG. 7 illustrates an embodiment with an optomodule 1 and a flange structural part 70, in which case, as in the embodiment in FIG. 4, the flange structural part 70 is directly fixed on a bottom surface 71 of the carrier substrate 2. A difference with respect to the embodiment according to FIG. 4 is that the optomodule 1 is not mounted with the aid of the soldering pads 11 on a printed circuit board section, rather the soldering pads 11 are connected to (lead frame) connecting pins 72. In this embodiment, a shielding plate 73 can also be shaped with the aid of the lead frame material and is soldered on in the same work operation as the connecting pins 72. The shielding plate 73 forms an electromagnetic shield for the optomodule 1.

Figure 8:
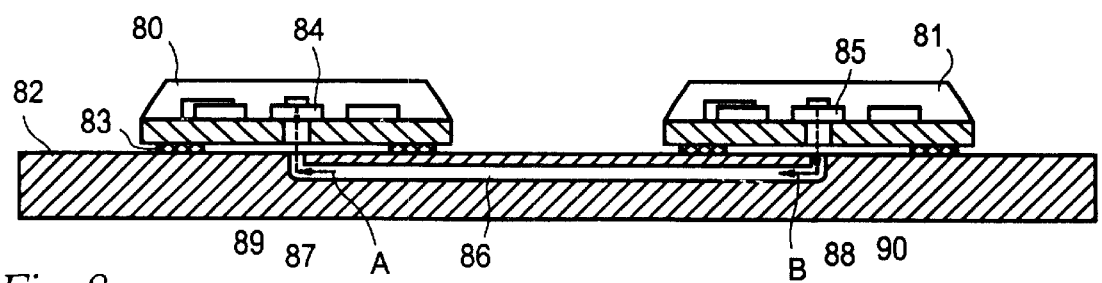
FIG. 8 is a side view showing an configuration having a printed circuit board section and, configured thereon, two optomodules according to FIG. 3.

FIG. 8 shows an application in which a first and a second optomodule 80, 81, which are configured in a manner corresponding to the optomodule 1 according to FIGS. 1a–1c, are mounted on a system printed circuit board 82 with the aid of soldered connections 83. Light signals can be exchanged between respective optosemiconductors 84, 85 of the first and of the second optomodule 80, 81 via a light channel 86 formed in the system printed circuit board 82. This is indicated with the aid of arrows A, B in FIG. 8. In this case, the light signals are deflected in corner regions 87, 88 of the light channel 86 with the aid of respective deflection mirrors 89 and 90.

Figure 9:
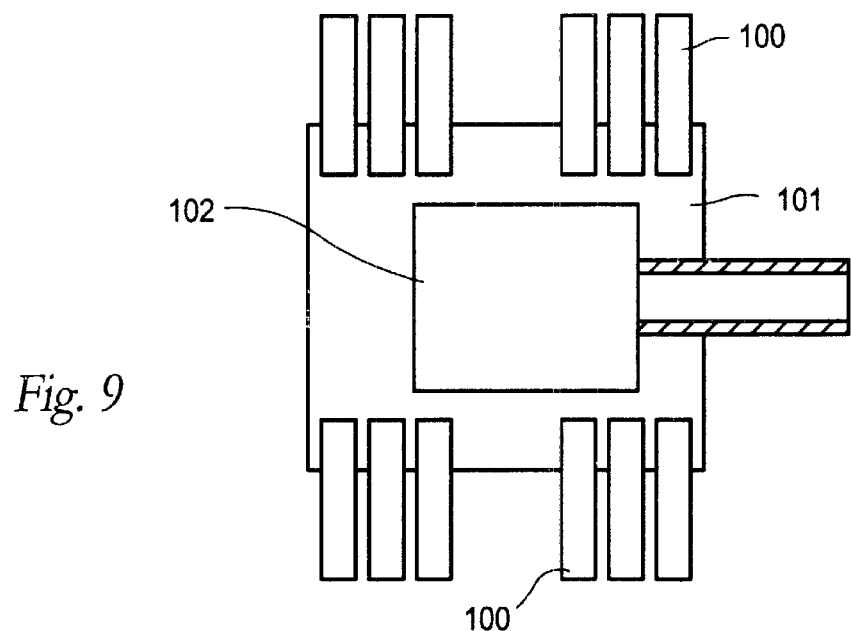
FIG. 9 is a plan view of an embodiment of an optomodule with connecting pins.
Figure 10:
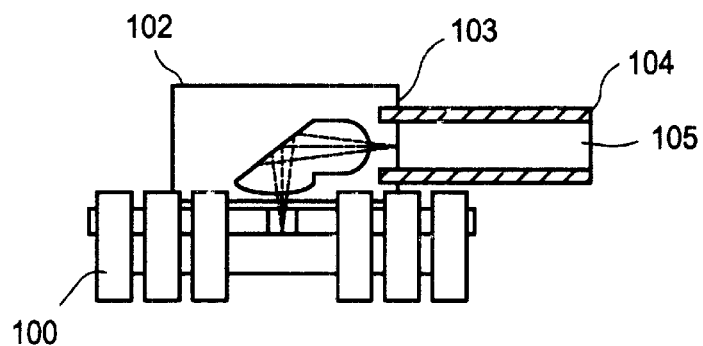
FIG. 10 is a front view of the embodiment of an optomodule with connecting pins.
Figure 11:
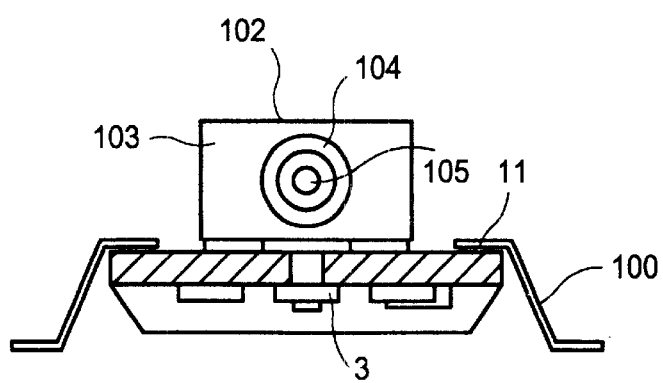
FIG. 11 is a side view of the embodiment of an optomodule with connecting pins.

FIGS. 9 to 11 illustrate an optomodule 1 according to FIGS. 1–3, in which the soldering pads 11 are connected to (lead frame) connecting pins 100. In the region of the through opening 13 in the carrier substrate 2, there is configured on a bottom surface 101 of the carrier substrate 2 an optical component 102 for directing the light emitted by the optosemiconductor 3. The optical component 102 is preferably bonded on in this case.

According to FIG. 11, the emitted light can be deflected with the aid of the optical component 102, a lateral surface 103 of the optical component 102 forming a stop face for a plug pin 104 with an optical waveguide 10. In this way, the light emerging from the optosemiconductor 3 can be coupled directly into the optical waveguide 105 of the plug pin 104. It goes without saying that light can be coupled from the optical waveguide 105 onto the optosemiconductor 3 in the same way.

I claim:

1. An optomodule comprising:
    a carrier substrate having a front side, a rear side, and a plated-through opening formed therein;
    wiring applied on said front side of said carrier substrate having at least one line;
    contacts configured on said rear side of said carrier substrate and electrically connected to a line of said wiring via said plated-through opening; and
    an optosemiconductor for transmitting and receiving light, said optosemiconductor electrically contacting said line of said wiring and being configured on said front side of said carrier substrate near said through opening formed in said carrier substrate, for transmitting and receiving the light through said through opening.

2. The optomodule according to claim 1, wherein said optosemiconductor is configured on said front-side surface of said carrier substrate.

3. The optomodule according to claim 1, including a protective layer at least partly surrounding said optosemiconductor and applied on said front side of said carrier substrate forming a substantially closed protective surface.

4. The optomodule according to claim 3, including a component configured on said front side of said carrier substrate, said component electrically contacting said optosemiconductor and said line of said wiring and being at least partly surrounded by said protective layer.

5. The optomodule according to claim 3, wherein said protective layer is formed by a potting compound.

6. The optomodule according to claim 3, wherein said protective layer is formed by an injection-molding compound.

7. The optomodule according to claim 4, wherein at least one of said optosemiconductor and said component is connected to said line of said wiring via a respective bonding connection.

8. The optomodule according to claim 1, wherein said wiring defines at least one wiring plane and a ground plane.

9. The optomodule according to claim 1, wherein said carrier substrate is formed from a printed circuit board material.

10. The optomodule according to claim 1, including an electromagnetic shield for said optosemiconductor formed from a shielding layer extending substantially over said carrier substrate.

11. The optomodule according to claim 4, including an electromagnetic shield for said component formed from a shielding layer extending substantially over said carrier substrate.

12. The optomodule according to claim 10, wherein said shielding layer is encompassed by said carrier substrate.

13. The optomodule according to claim 1, wherein said contacts are solder balls.

14. The optomodule according to claim 1, including connecting pins mechanically and electrically connected to said contacts.

15. The optomodule according to claim 1, including an optical imaging element configured in said through opening.

16. The optomodule according to claim 1, including an optical element configured on said rear surface of said carrier substrate, so that light passing through the through said plated-through opening can be directed optically.

17. A connection configuration, comprising:
    an optomodule including a carrier substrate having a front side and a rear side and a plated-through opening formed therein, wiring applied on said front side of said carrier substrate having at least one line, contacts configured on said rear side of said carrier substrate and electrically connected to a line of said wiring via said plated-through opening, and an optosemiconductor for transmitting and receiving light, said optosemiconductor electrically contacting said line of said wiring and being configured on said front side of said carrier substrate near said through opening formed in said carrier substrate, for transmitting and receiving the light through said through opening; and
    a printed circuit board section having wiring;
    said contacts electrically contacting said wiring of said printed circuit board section and said optomodule and said contacts mounted on said printed circuit board section to permit light to be passed through an opening in said printed circuit board section.

18. The connection configuration according to claim 17, wherein said printed circuit board section forms a light channel, causing transmitted light transmitted from said optosemiconductor and passing through the through said through-opening in said carrier substrate to be coupled into said light channel, and causing received to be coupled from said light channel through said through-opening in said carrier substrate onto said optosemiconductor.

19. The connection configuration according to claim 18, including an optical deflector configured in said light channel.

20. The connection configuration according to claim 19, including an optical imager configured in said light channel.

21. The connection configuration according to claim 18, including an optical imager configured in said light channel.

22. The connection configuration according to claim 17, including:
    a plug receptacle part; and
    a section of a flange structural part having an end-side surface section and a receptacle section configured in said opening in said printed circuit board section, forming a connection between an end-side surface section of said flange structural part and said rear surface of said carrier substrate, said flange structural part having a receptacle section for at least partly receiving said plug structural part, and said plug structural part being configured in said receptacle section for coupling the light emitted by said optosemiconductor and the light received by said optosemiconductor through said plug structural part.

23. The connection configuration according to claim 22, including an optical imaging element configured in the flange structural part for coupling the light through said plug structural part.

24. The connection configuration according to claim 17, including
- a plug structural part; and
- a flange structural part configured on a surface of said printed circuit board section; said surface being remote from said optomodule and by said through opening in said printed circuit board section; said flange structural part having a receptacle section for at least partly receiving said plug structural part, said plug structural part being configured in said receptacle section for coupling the light passing through said optosemiconductor through said plug structural part.

25. The connection configuration according to claim 24, including an optical imaging element configured in the flange structural part for coupling the light through said plug structural part.

* * * * *